United States Patent
Huang et al.

(10) Patent No.: US 8,884,816 B2
(45) Date of Patent: Nov. 11, 2014

(54) TEMPERATURE COMPENSATING DEVICE AND SATELLITE SIGNAL RECEIVING SYSTEM

(75) Inventors: Chen-Chia Huang, Hsinchu (TW); Chun-Ching Wang, Hsinchu (TW); Cho-Hsuan Wu, Hsinchu (TW)

(73) Assignee: Wistron NeWeb Corporation, Hsinchu Science Park, Hsinchu (TW)

( * ) Notice: Subject to any disclaimer, the term of this patent is extended or adjusted under 35 U.S.C. 154(b) by 426 days.

(21) Appl. No.: 13/092,133

(22) Filed: Apr. 21, 2011

(65) Prior Publication Data
US 2012/0194380 A1 Aug. 2, 2012

(30) Foreign Application Priority Data
Feb. 1, 2011 (TW) .............................. 100103801 A

(51) Int. Cl.
*G01S 19/23* (2010.01)
(52) U.S. Cl.
CPC ............... *G01S 19/235* (2013.01); *G01S 19/23* (2013.01)
USPC ........................................................ 342/357.62

(58) Field of Classification Search
CPC ............................... G01S 19/23; G01S 19/235
USPC ........................................................ 342/357.62
See application file for complete search history.

(56) References Cited

U.S. PATENT DOCUMENTS

| 5,200,655 | A * | 4/1993 | Feldt ............................. 327/346 |
| 6,466,634 | B1 * | 10/2002 | O'Toole et al. ............... 375/374 |
| 7,903,025 | B2 * | 3/2011 | Yanni ....................... 342/357.62 |
| 2003/0179608 | A1 * | 9/2003 | Iorio ........................ 365/189.09 |
| 2004/0190332 | A1 * | 9/2004 | Iorio ............................. 365/154 |
| 2009/0296769 | A1 * | 12/2009 | Fiennes et al. .................... 374/1 |

* cited by examiner

*Primary Examiner* — Frank J McGue
(74) *Attorney, Agent, or Firm* — Winston Hsu; Scott Margo

(57) ABSTRACT

A temperature compensating device for providing active bias for an amplifier includes a voltage source, a plurality of loads, and a current generator for generating a current for the amplifier according to voltages provided by the voltage source and the plurality of loads, wherein a first load of the plurality of loads is a thermistor utilized for keeping the current within a specified range under a plurality of ambient temperatures.

12 Claims, 8 Drawing Sheets

TEMPERATURE COMPENSATING DEVICE AND SATELLITE SIGNAL RECEIVING SYSTEM

BACKGROUND OF THE INVENTION

1. Field of the Invention

The present invention relates to a temperature compensating device and satellite signal receiving system, and more particularly, to a temperature compensating device and satellite signal receiving system which compensates for effects of ambience temperature variation through current stabilizing, to ensure normal system operation.

2. Description of the Prior Art

Temperature is a critical factor in characteristics of electronic component; therefore, an ideal electronic product must be able to maintain a stable performance within a reasonable temperature range. To meet this requirement, electronic systems have temperature compensating mechanisms to compensate for effects of temperature changes.

In a satellite receiver, for example, after an antenna receives radio frequency signals transmitted by a satellite, a radio frequency amplifier first amplifies the received radio frequency signals, and then a mixer utilizes an oscillating signal of a local oscillator to lower the radio frequency signals to an intermediate or baseband frequency. In this process, abnormal operations in the mixer or the local oscillator would cause demodulation or decoding failure of analog or digital circuits in subsequent stages, leading to malfunction of the satellite receiver. A key influencing factor in operations of the mixer or the local oscillator is ambience temperature change, mainly because satellite receives are often situated outdoors and unsheltered; and in regions where outdoor temperature differences may exceed 50 degrees Celsius, such vast temperature ranges may cause changes in characteristics of electronic components (e.g. resistance values, capacitance values, conduction impedance of transistors, etc.), leading to malfunction of the mixer or the local oscillator.

Specifically, the mixer principally operates by utilizing a local oscillator to multiply the radio frequency signals and the local oscillating signal, and then filtering out unneeded signals with a band-pass filter. The local oscillator has a basic structure of a loop constructed from band-pass filters and amplifiers, mainly for repeatedly amplifying noise signals to acquire needed oscillations, and the band-pass filter filters signals at designed frequencies. As is well known by the industry, a multitude of electronic components, e.g. transistors, capacitors, resistors, etc, are required to implement the mixer and the local oscillator, thus making them prone to temperature differences.

Conventional temperature compensating mechanisms are usually implemented through fixed voltages, which have limited stabilizing effects on transistors, thus a fixed current temperature compensating mechanism is required.

SUMMARY OF THE INVENTION

Therefore, the present invention primarily provides a temperature compensating device and satellite signal receiving system.

The present invention discloses a temperature compensating device, for providing an active bias to an amplifier, which includes a voltage source; a plurality of loads; and a current generator for generating a current to the amplifier according to a voltage provided by the voltage source and the plurality of loads; wherein a first load in the plurality of loads is a thermistor for keeping the current within a specified range under a plurality of ambient temperatures.

The present invention further discloses a satellite signal receiving system including an antenna for receiving a satellite signal; a radio frequency amplifier coupled to the antenna, for amplifying the satellite signal; a local oscillator for generating a local oscillating signal; a mixer coupled to the radio frequency amplifier and the local oscillator, for mixing the satellite signal and the local oscillating signal, to generate a down-converted result of the satellite signal; and a temperature compensating device for providing an active bias to the mixer, including a voltage source; a plurality of loads; and a current generator, for generating a current according to a voltage provided by the voltage source and the plurality of loads to the amplifier; wherein a first load of the plurality of loads is a thermistor for keeping the current within a specified range under a plurality of ambient temperatures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
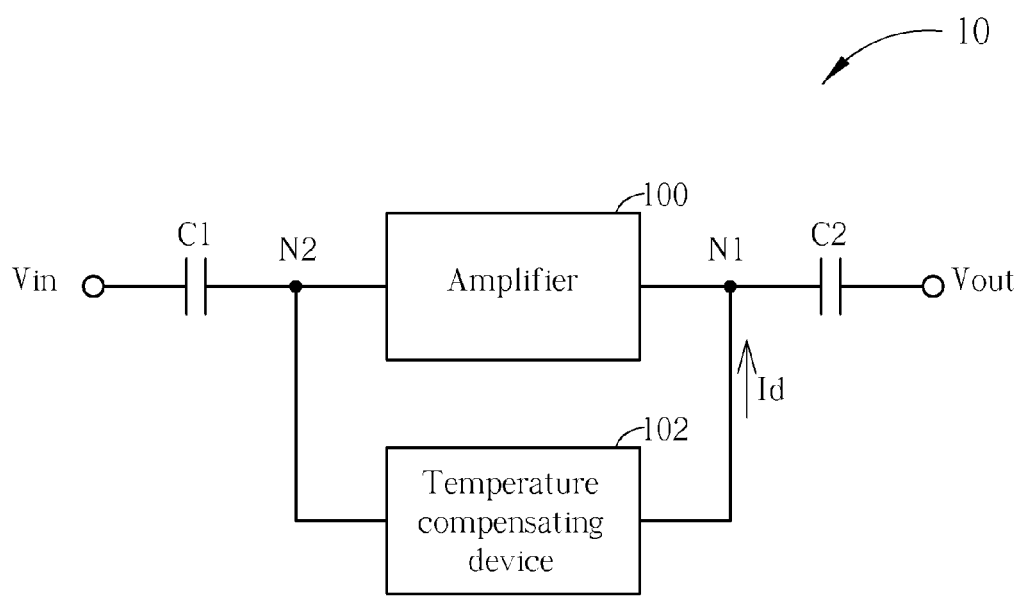
FIG. 1 is a schematic diagram of an amplifier circuit according to an embodiment of the present invention.

Please refer to FIG. 1, which is a schematic diagram of an amplifier circuit 10 according to an embodiment of the present invention. The amplifier circuit 10 amplifies an input signal Vin into an output signal Vout, and compensates for effects of temperature on gain. The amplifier circuit 10 mainly includes an amplifier 100, a temperature compensating device 102 and capacitors C1 and C2. The amplifier 100 can be an amplifier of any form, e.g. a bipolar junction transistor, a field effect transistor, a Darlington transistor, an operational amplifier, etc. Note that, the term "amplifier" is well known by those skilled in the art; devices which amplify signal amplitudes (i.e. with gain greater than 1), reduce signal amplitudes (i.e. gain smaller than 1), invert signal phases (i.e. gain equals −1), maintain signal amplitudes (i.e. gain equals 1, used for buffering), etc., are all included in the "amplifier" referred to herein, and may all serve as temperature compensating mechanisms in the present invention. As shown in FIG. 1, the temperature compensating device 102 is coupled to nodes N1, N2, to provide an active bias to the amplifier 100, which mainly serves to provide a stable current Id to eliminate effects of temperature change on a gain of the amplifier 100.

The basic structure of the temperature compensating device 102 consists of a plurality of loads, a voltage source and a current generator. The current generator generates a current to the amplifier 100 according to the loads and a voltage provided by the voltage source, wherein at least one load of the plurality of loads is a thermistor with parameters configured to maintain the generated current within a stable range under different ambient temperatures. Following are illustrations of different embodiments of feasible architectures for the temperature compensating device 102.

Figure 2A:
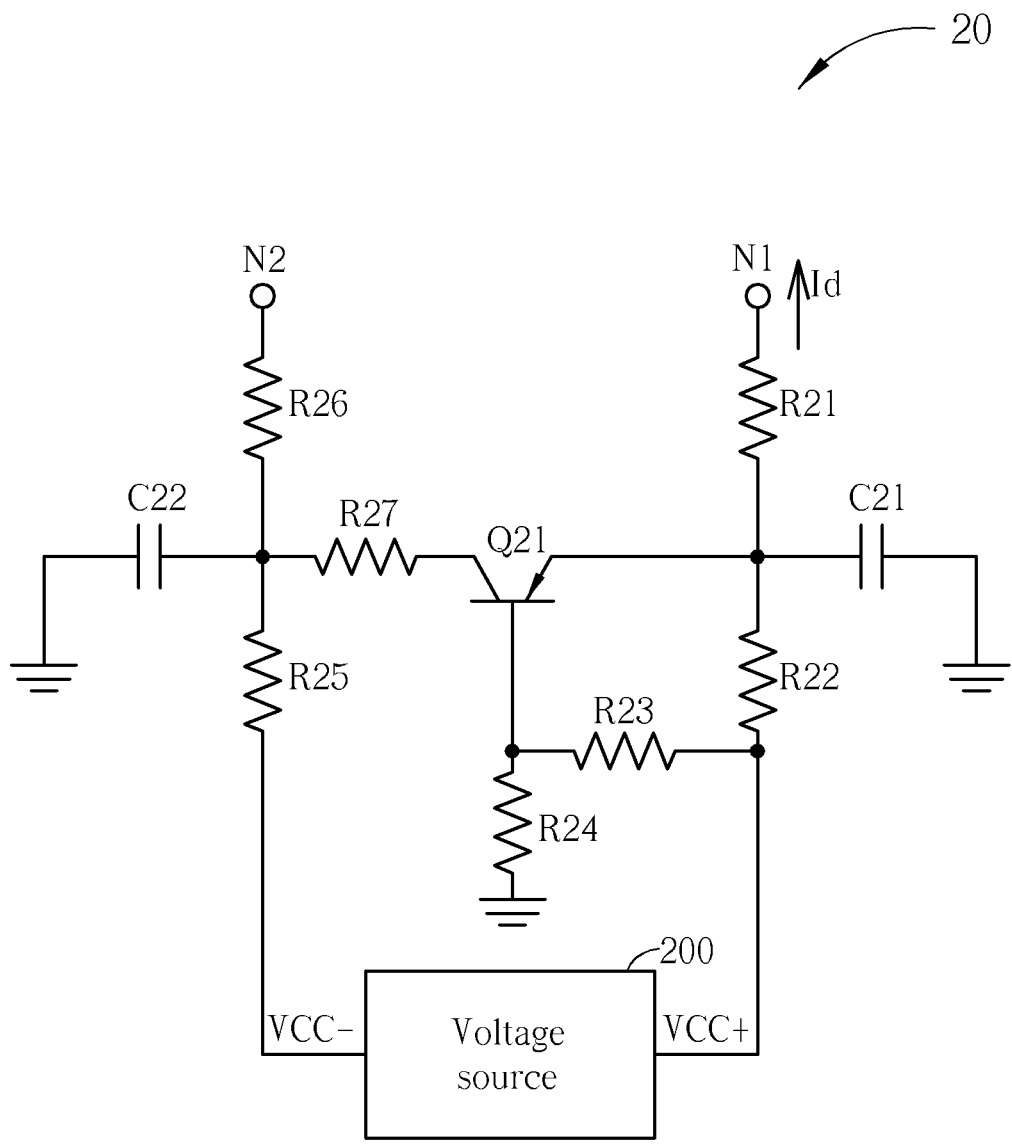
FIG. 2A is a schematic diagram of a temperature compensating device according to an embodiment of the present invention.

Please refer to FIG. 2A, which is a schematic diagram of a temperature compensating device 20 according to an embodiment of the present invention. The temperature compensating device 20 is utilized to implement the temperature compensating device 102 of FIG. 1, and includes a voltage source 200, a bipolar junction transistor Q21, resistors R21-R27 and capacitors C21, C22. The voltage source 200 provides voltages VCC+, VCC−, the bipolar junction transistor Q21 acts as a current generator, for generating the current Id according to the voltages VCC+, VCC− and the resistors R21-R27. Depending on different requirements, the resistors R22, R23, R24, R25 and R27 may all be thermistors, and the resistors R23, R24 or R27 may be omitted. If the resistors R23, R24 are omitted, then a base of the bipolar junction transistor Q21 is grounded, and the resistor R22 is directly connected to the voltage source 200; if resistor R27 is omitted, then a collector of the bipolar junction transistor Q21 is connected to a node formed by resistors R25, R26 and the capacitor C22.

Figure 2B:
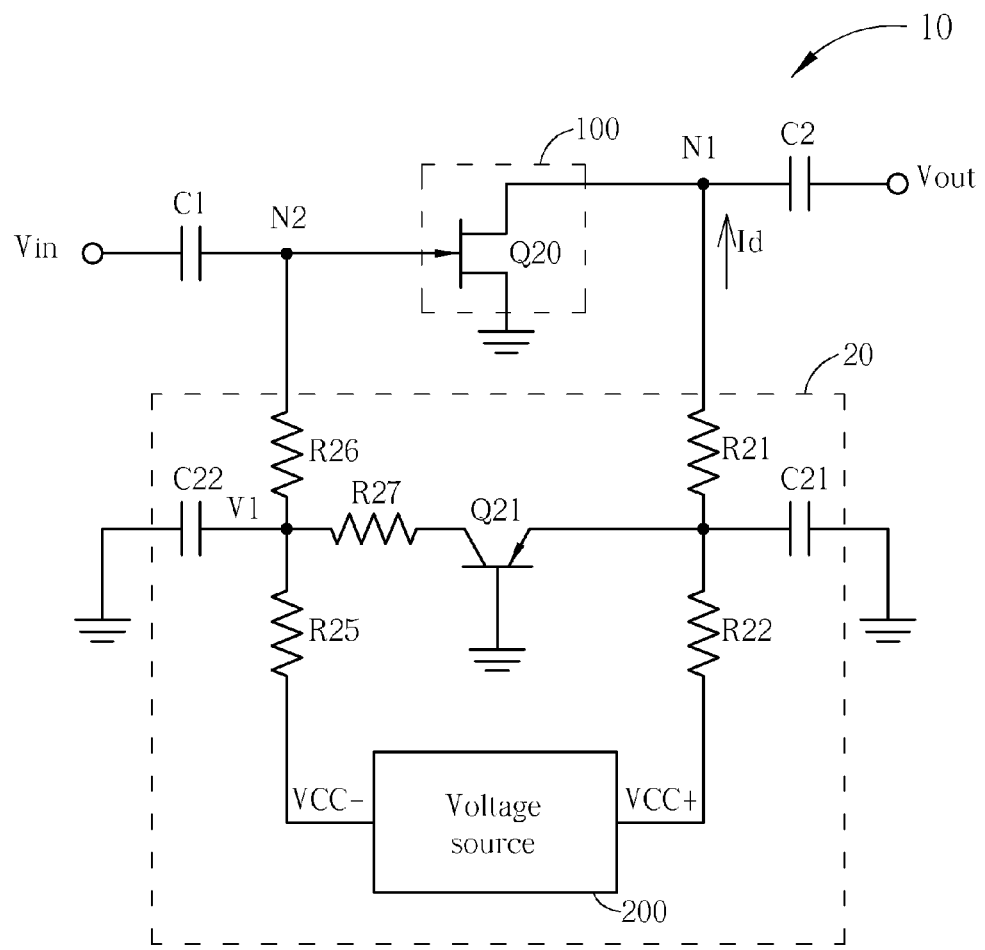
FIG. 2B is a schematic diagram of applying the temperature compensating device of FIG. 2A in the amplifier circuit of FIG. 1.

Next, please refer to FIG. 2B, which is a schematic diagram of the temperature compensating device 20 applied to the amplifier circuit 10, wherein the amplifier 100 is implemented by an N-channel field effect transistor Q20, while omitting the resistors R23, R24 in the temperature compensating device 20, and choosing the resistor R27 as the thermistor, i.e. impedance of the resistor R27 decreases with an increase in the temperature. Furthermore, as is well known to those skilled in the art, a gain of the N-channel field effect transistor Q20 increases with higher gate voltage and decreases with higher temperatures. Therefore, with an increase in the temperature, an impedance of the resistor R27 decreases, the voltage V1 increases, and the gate voltage of the N-channel field effect transistor Q20 also increases simultaneously, thus increasing the gain of the N-channel field effect transistor Q20, compensating for an original decrease in the gain for the N-channel field effect transistor Q20 due to temperature rise.

Therefore, as can be shown by FIG. 2B, by choosing the resistor R27 to be a thermistor, an original decrease in the gain due to rising temperatures may be compensated for. Likewise, an increase in the gain due to temperature decrease may also be compensated for. Simply put, the temperature compensating device 20 mainly serves to stabilize the current Id, to adjust the voltage V1 with the temperature; this in turn alters the gate voltage of the N-channel field effect transistor Q20, thus tuning its gain to adapt to the temperature.

Note that, FIGS. 2A and 2B merely serve to illustrate the concept of the present invention, and any modification made accordingly is within the scope of the present invention. For instance, the bipolar junction transistor Q21 may be substituted with other forms of transistors, depending on system requirements. Furthermore, choosing an optimal thermistor may be difficult since a selection of temperature coefficients may be limited due to different normal temperature impedance values of thermistors. Therefore, impedances of each resistor may be further fine-tuned, and extra resistors may be added in parallel, etc. For example, in FIG. 2C, the resistor R27 is further connected in parallel to another resistor R28.

Figure 2C:
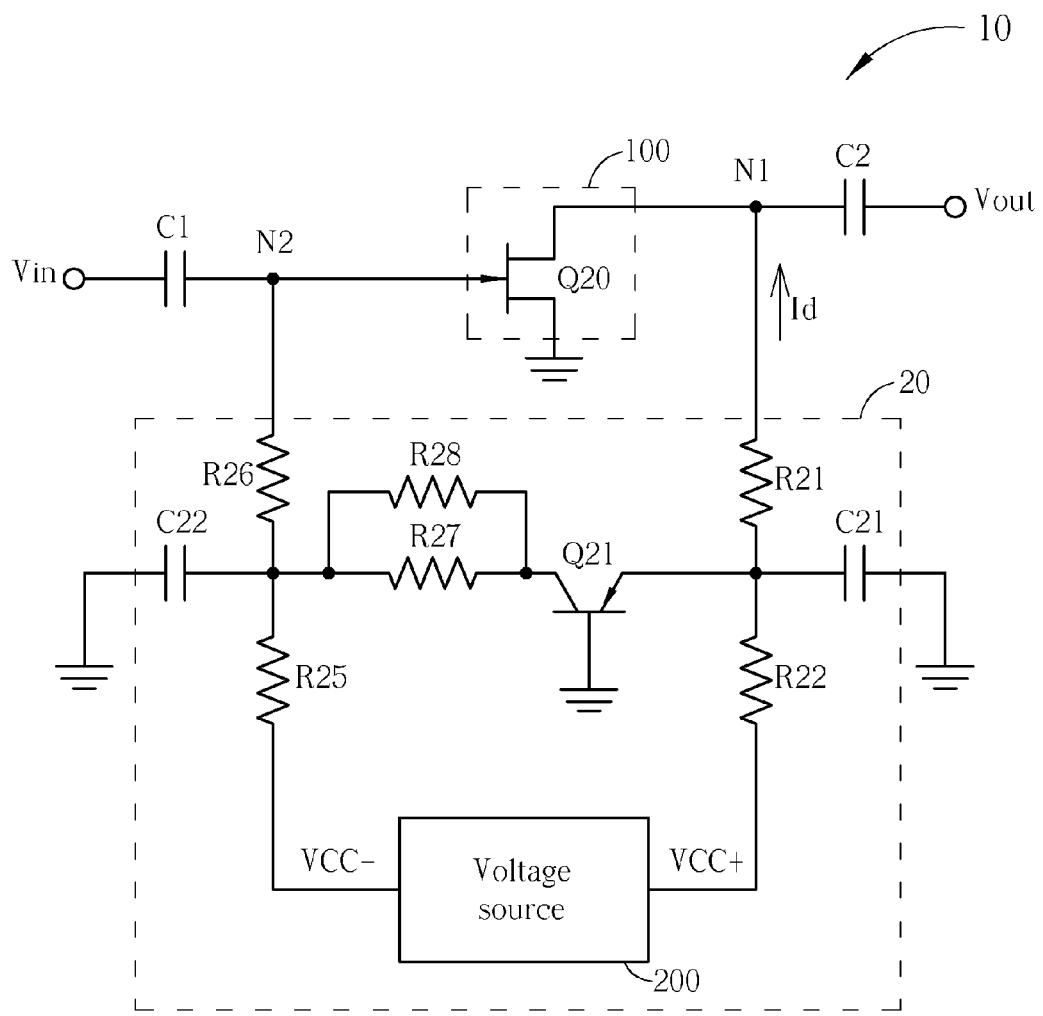
FIG. 2C is a schematic diagram of an embodiment variation of FIG. 2B.
Figure 3:
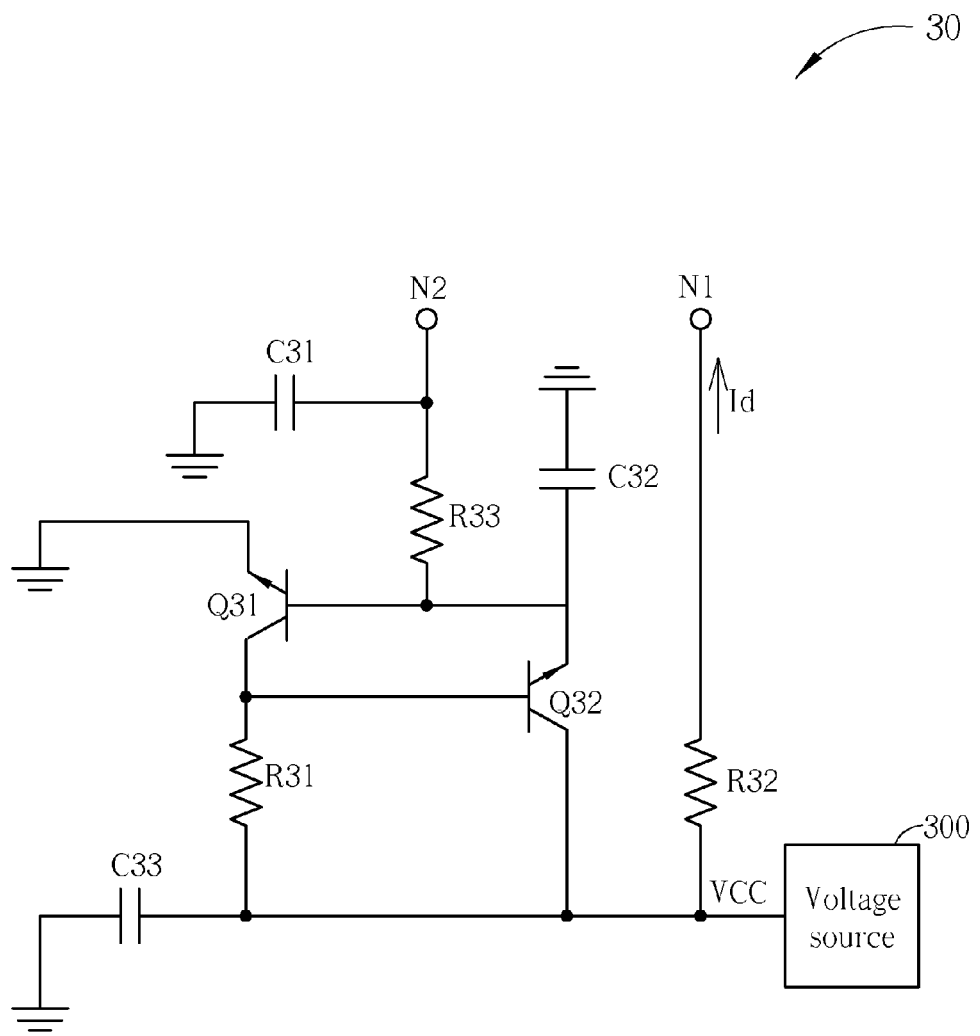
FIGS. 3 and 4 are schematic diagrams of different embodiments of a temperature compensating device according to the present invention.

Additionally, please refer to FIG. 3, which is a schematic diagram of a temperature compensating device 30 according to an embodiment of the present invention. The temperature compensating device 30 implements the temperature compensating device 102 of FIG. 1, and includes a voltage source 300, bipolar junction transistors Q31, Q32, resistors R31-R33 and capacitors C31-C33. The voltage source 300 provides a voltage VCC, the bipolar junction transistors Q31, Q32 are a cascode structure, used as a current generator, for generating the current Id according to the voltage VCC and resistors R31-R33. Depending on different requirements, the resistors R31, R33 may be thermistors; if an optimal thermistor cannot be selected, it is possible to further modify the impedances of each of the resistors R31-R33, or add extra resistors in parallel, as shown in FIG. 2C.

Figure 4:
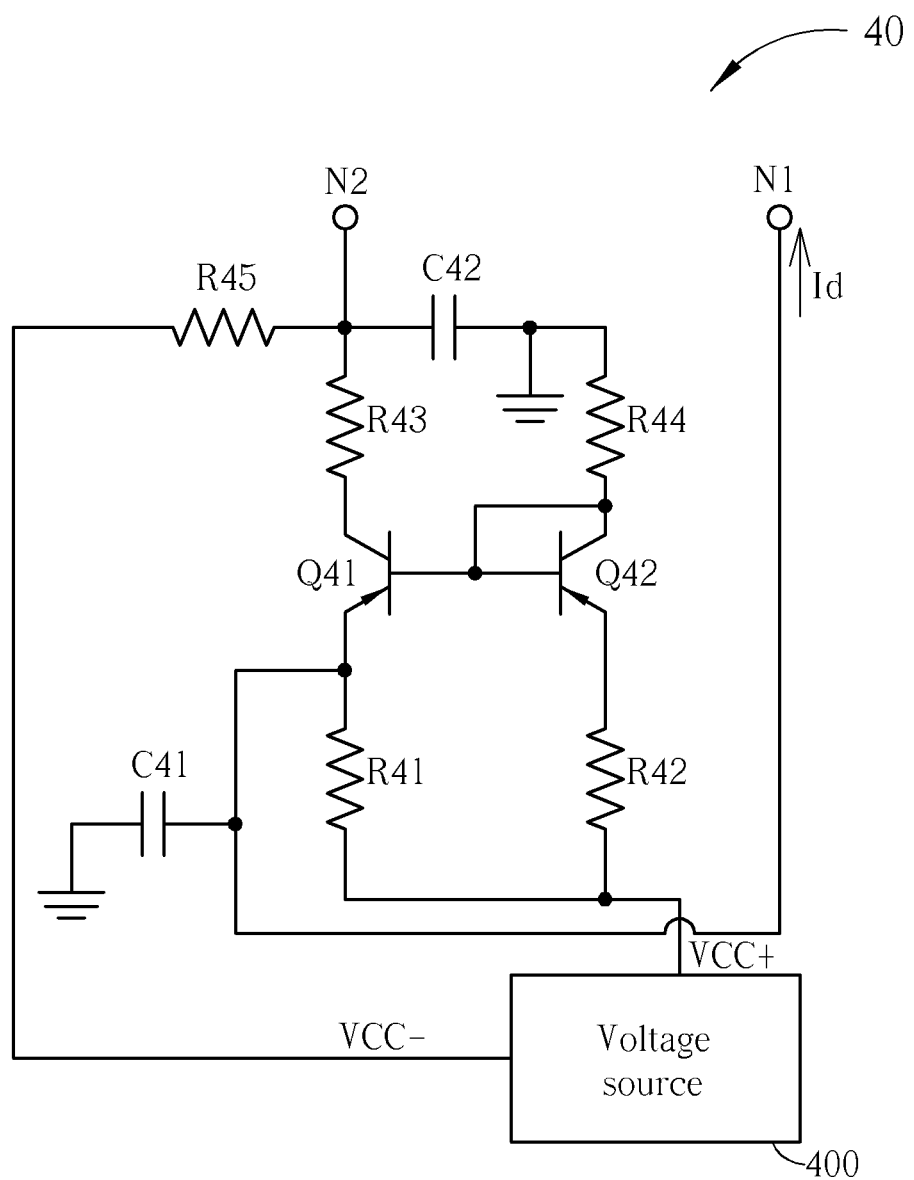

Furthermore, please refer to FIG. 4, which is a schematic diagram of a temperature compensating device 40 according to an embodiment of the present invention. The temperature compensating device 40 implements the temperature compensating device 102 of FIG. 1, and includes a voltage source 400, bipolar junction transistors Q41, Q42, resistors R41-R45 and capacitors C41, C42. The voltage source 400 provides voltages VCC+, VCC−, the bipolar junction transistors Q41, Q42 form a current mirror to act as a current generator, for generating current Id according to the voltages VCC+, VCC− and the resistors R41-R45. Depending on different requirements, the resistors R42, R44 may both be thermistors; if an optimal thermistor cannot be selected, it is possible to further adjust impedance values of each of the resistors R41-R45, or add extra resistors in parallel, as shown in FIG. 2C.

FIGS. 2A-2C, 3 and 4 are all feasible embodiments for the temperature compensating device 102 of FIG. 1, yet other possibilities are not limited thereto; any other structures capable of stabilizing the current Id, constructed from a voltage source, a current generator and a load with at least one thermistor are all within the scope of the present invention.

Furthermore, as mentioned, the amplifier 100 of FIG. 1 may be a bipolar junction transistor, a field effect transistor, a Darlington transistor, or an operational amplifier, etc, and is not limited to devices which increase signal amplitudes. Therefore, it is possible to further apply the temperature compensating device of the present invention in satellite signal receiving systems.

Figure 5A:
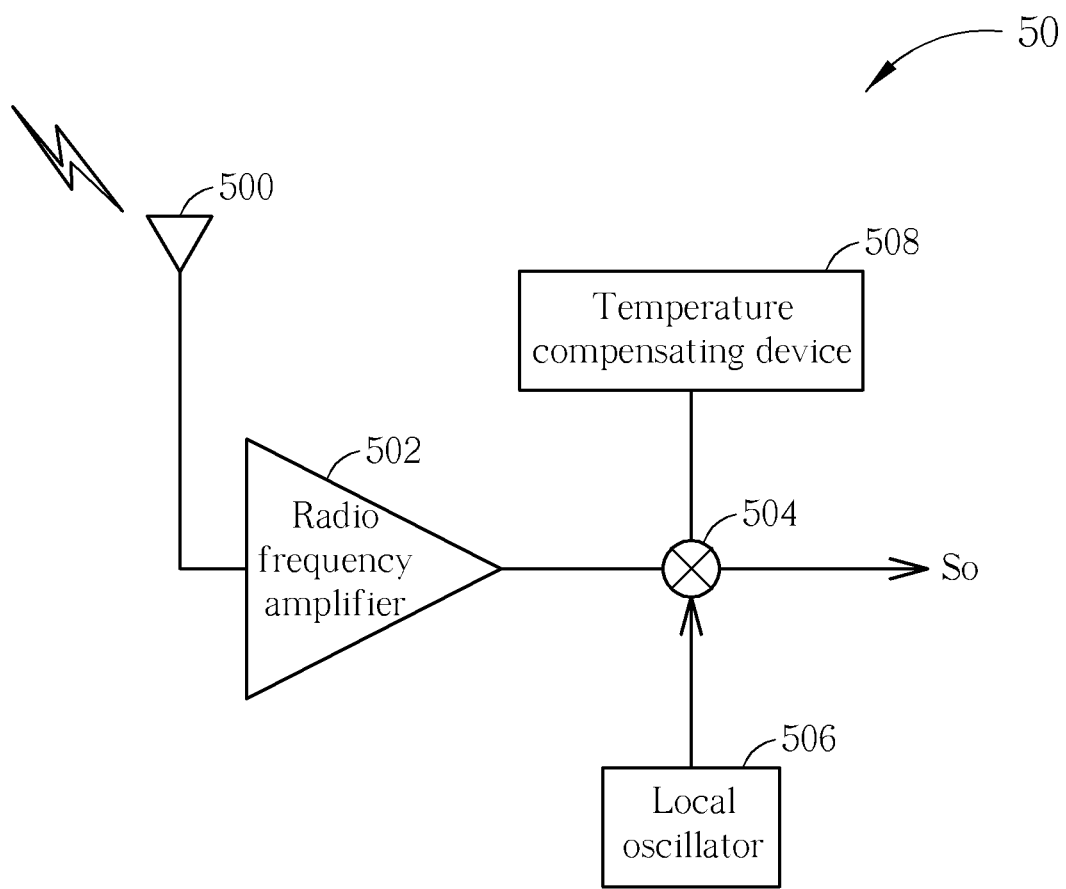
FIGS. 5A and 5B are schematic diagrams of applying the temperature compensating device of the present invention to a satellite signal receiving system.

For example, please refer to FIG. 5A, which is a schematic diagram of a satellite signal receiving system 50. The satellite signal receiving system 50 includes an antenna 500, a radio frequency amplifier 502, a mixer 504, a local oscillator 506 and a temperature compensating device 508. After the antenna 500 receives a satellite signal, the radio frequency amplifier 502 amplifies the satellite signal accordingly. The local oscillator 506 is used for generating a local oscillating signal, and the mixer 504 mixes the satellite signal outputted by the radio frequency amplifier 502 and the local oscillating signal, to generate a down-converted result So of the satellite signal, for further processing in later intermediate frequency or baseband stages. The temperature compensating device 508 may be same as illustrated in FIGS. 2A-2C, 3 and 4, or suitable modifications thereof, for providing an active bias to the mixer 504, and for maintaining a current provided to (or sourced from) the mixer 504 within a specified range under different ambient temperatures. In this way, it is possible to ensure stable gains of the amplifier in the mixer 504 under different temperatures, preventing malfunction of the mixer 504 due to drastic temperature changes.

Figure 5B:
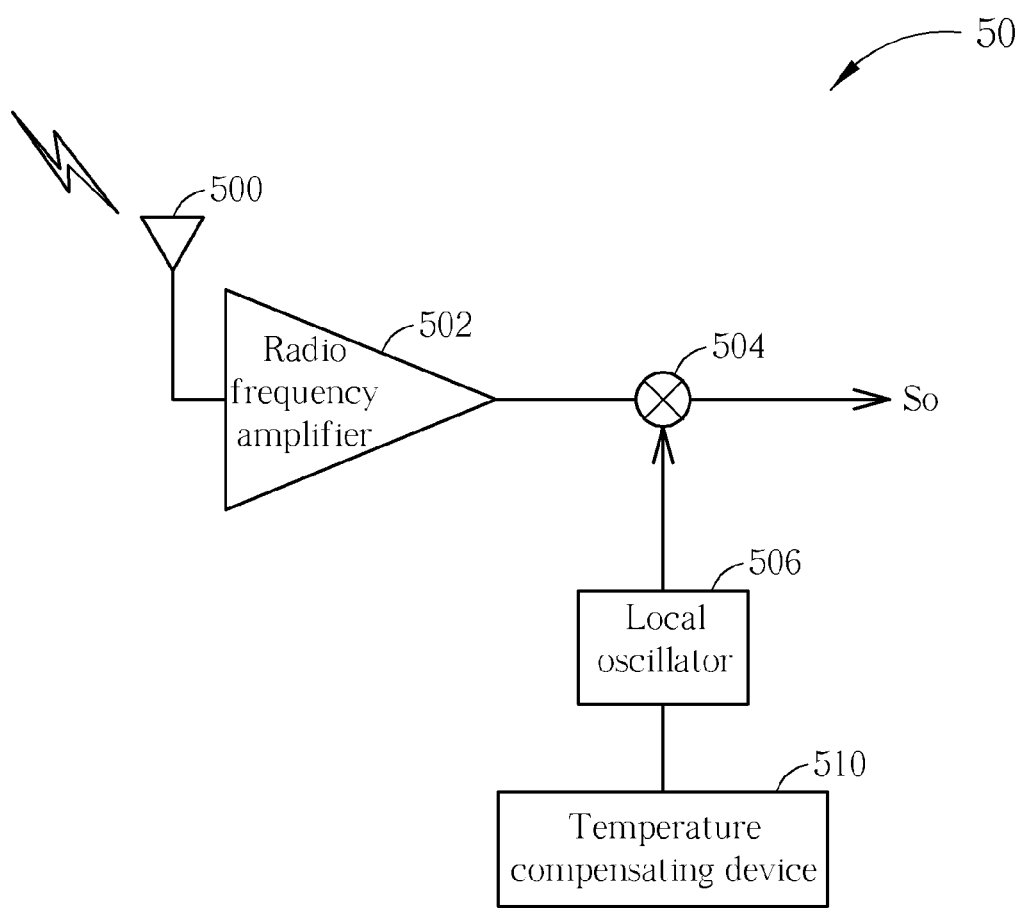

Similarly, as shown in FIG. 5B, it is also possible to utilize a temperature compensating device 510 to provide the active bias to the local oscillator 506, such that the amplifier in the local oscillator 506 has a stable gain under different temperatures, to prevent the local oscillator 506 from malfunctioning due to vast differences in temperature.

In summary, the present invention compensates for effects caused by temperature changes through current stabilization, thus enhancing stabilizing effect of the transistor and ensuring normal system operation.

Those skilled in the art will readily observe that numerous modifications and alterations of the device and method may be made while retaining the teachings of the invention.

What is claimed is:

1. A temperature compensating device, for providing an active bias to an amplifier, comprising:
   a first node, electrically connected to an output of the amplifier;
   a second node, electrically connected to an output of the amplifier;
   a voltage source;
   a plurality of loads, for providing a current to the first node according to a first voltage provided by the voltage source and providing a second voltage to the second node, wherein at least tow loads of the plurality of loads are electrically connected to the first node and the second node; and
   only a current generator, for adjusting the current provided to the first node according to an impedance variation caused by a first load of the plurality of loads for keeping the current within a specified range;
   wherein the first load of the plurality of loads is a thermistor for generating the impedance variation in response to variation of an ambient temperature;
   wherein the second voltage varies in response to the impedance variation caused by the first load.

2. The temperature compensating device of claim 1, wherein the current generator is a bipolar junction transistor.

3. The temperature compensating device of claim 2, wherein the first load is between a collector of the bipolar junction transistor and the voltage source, or between a base of the bipolar junction transistor and a ground, or between the base of the bipolar junction transistor and the voltage source, or between an emitter of the bipolar junction transistor and the voltage source.

4. The temperature compensating device of claim 1, wherein the current generator comprises a cascode of a first bipolar junction transistor and a second bipolar junction transistor, and the first load is between a base of the first bipolar junction transistor and the amplifier, or between a base of the second bipolar junction transistor and the voltage source.

5. The temperature compensating device of claim 1, wherein the current generator is a current mirror.

6. The temperature compensating device of claim 5, wherein the current mirror comprises a first bipolar junction transistor and a second bipolar junction transistor, a base of the first bipolar junction transistor is coupled to a base and a collector of the second bipolar junction transistor and the first load is between the collector of the second bipolar junction transistor and a ground, or between an emitter of the second bipolar junction transistor and the voltage source.

7. A satellite signal receiving system, comprising:
   an antenna, for receiving a satellite signal;
   a radio frequency amplifier, coupled to the antenna, for amplifying the satellite signal;
   a local oscillator, for generating a local oscillating signal;
   a mixer, coupled to the radio frequency amplifier and the local oscillator, for mixing the satellite signal and the local oscillating signal, to generate a down-converted result of the satellite signal; and
   a temperature compensating device, for providing an active bias to the mixer, comprising:
      a first node, electrically connected to an output of the amplifier;
      a second node, electrically connected to an input of the amplifier;
      a voltage source;
      a plurality of loads; for providing a current to the first node according to a first voltage provided by the voltage source and providing a second voltage to the second node, wherein at least two loads of the plurality of loads are electrically connected to the first node and the second node; and
      only a current generator, for adjusting the current provided to the first node according to an impedance variation caused by a first load of the plurality of loads for keeping the current within a specified range;
      wherein the first load of the plurality of loads is a thermistor for generating the impedance variation in response to variation of an ambient temperature;
      wherein the second voltage varies in response to the impedance variation caused by the first load.

8. The satellite signal receiving system of claim 7, wherein the current generator is a bipolar junction transistor.

9. The satellite signal receiving system of claim 8, wherein the first load is between a collector of the bipolar junction transistor and the voltage source, or between a base of the bipolar junction transistor and a ground, or between the base of the bipolar junction transistor and the voltage source, or between an emitter of the bipolar junction transistor and the voltage source.

10. The satellite signal receiving system of claim 7, wherein the current generator comprises a cascode of a first bipolar junction transistor and a second bipolar junction transistor, and the first load is between a base of the first bipolar junction transistor and the amplifier, or between a base of the second bipolar junction transistor and the voltage source.

11. The satellite signal receiving system of claim 7, wherein the current generator is a current mirror.

12. The satellite signal receiving system of claim 11, wherein the current mirror comprises a first bipolar junction transistor and a second bipolar junction transistor, a base of the first bipolar junction transistor is coupled to a base and a collector of the second bipolar junction transistor, and the first load is between the collector of the second bipolar junction transistor and a ground, or between an emitter of the second bipolar junction transistor and the voltage source.

* * * * *